United States Patent
Kwak et al.

(10) Patent No.: US 9,857,444 B2
(45) Date of Patent: Jan. 2, 2018

(54) MAGNETIC RESONANCE IMAGING APPARATUS WITH A CONNECTOR SHAPE DEFINED BY A SUPERPOSITION OF AN H AND AN X

(71) Applicant: SAMSUNG ELECTRONICS CO., LTD., Suwon-si (KR)

(72) Inventors: Jun Suk Kwak, Gwangju-si (KR); Atul Minhas, Suwon-si (KR); Ku Cheol Ahn, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 452 days.

(21) Appl. No.: 14/565,625

(22) Filed: Dec. 10, 2014

(65) Prior Publication Data

US 2015/0168520 A1    Jun. 18, 2015

(30) Foreign Application Priority Data

Dec. 17, 2013  (KR) .......................... 10-2013-0157553

(51) Int. Cl.
*H01F 41/00*       (2006.01)
*G01R 33/3873*  (2006.01)
(Continued)

(52) U.S. Cl.
CPC ..... *G01R 33/4215* (2013.01); *G01R 33/3858* (2013.01); *H01F 41/00* (2013.01);
(Continued)

(58) Field of Classification Search
USPC .......................... 324/300–322; 600/407–435; 382/128–131
See application file for complete search history.

(56) References Cited

U.S. PATENT DOCUMENTS 5,786,695 A    7/1998  Amor et al.
6,236,209 B1  5/2001  Arz et al.
(Continued)

FOREIGN PATENT DOCUMENTS

JP    2001-212107 A    8/2001
JP    2005-125117 A    5/2005
(Continued)

OTHER PUBLICATIONS

Communication dated Dec. 1, 2015, issued by the Korean Intellectual Property Office in corresponding Korean Application No. 10-2013-0157553.
(Continued)

*Primary Examiner* — Melissa Koval
*Assistant Examiner* — Tiffany Fetzner
(74) *Attorney, Agent, or Firm* — Sughrue Mion, PLLC

(57) ABSTRACT

Disclosed herein is a magnetic resonance imaging apparatus which includes a connector. A magnetic resonance imaging apparatus includes a static coil module configured to form a static field in a bore, a gradient coil module which includes at least one primary coil configured to form a gradient field in the static field and at least one shield coil configured to cancel an eddy current formed in the static coil module, and a connector which includes a base made of an insulating material and a plurality of conductors which are coupled to the base and which are configured to connect the at least one primary coil and the at least one shield coil.

20 Claims, 13 Drawing Sheets

(51) Int. Cl.
*G01R 33/421* (2006.01)
*G01R 33/385* (2006.01)
(52) U.S. Cl.
CPC ...... *G01R 33/3856* (2013.01); *G01R 33/3873* (2013.01); *Y10T 29/4902* (2015.01)

(56) References Cited

U.S. PATENT DOCUMENTS

| | | | |
|---|---|---|---|
| 8,552,726 B2* | 10/2013 | Sakakura | G01R 33/3854 |
| | | | 324/318 |
| 8,890,529 B2* | 11/2014 | Jiang | G01R 33/385 |
| | | | 324/318 |
| 2011/0074419 A1* | 3/2011 | Sakakura | G01R 33/3854 |
| | | | 324/318 |
| 2012/0306495 A1* | 12/2012 | Jiang | G01R 33/385 |
| | | | 324/318 |
| 2014/0061202 A1* | 3/2014 | Mathieu | G01R 33/3804 |
| | | | 220/560.09 |
| 2015/0168520 A1* | 6/2015 | Kwak | G01R 33/4215 |
| | | | 324/318 |

FOREIGN PATENT DOCUMENTS

| | | | |
|---|---|---|---|
| JP | 2005-152632 A | 6/2005 | |
| JP | 2008-183397 A | 8/2008 | |

OTHER PUBLICATIONS

Communication dated Apr. 23, 2015 issued by the European Patent Office in counterpart European Patent Application No. 14196284.5.

\* cited by examiner

MAGNETIC RESONANCE IMAGING APPARATUS WITH A CONNECTOR SHAPE DEFINED BY A SUPERPOSITION OF AN H AND AN X

CROSS-REFERENCE TO RELATED APPLICATION

This application claims priority from Korean Patent Application No. 10-2013-0157553, filed on Dec. 17, 2013 in the Korean Intellectual Property Office, the disclosure of which is incorporated herein by reference in its entirety.

BACKGROUND

1. Field

Exemplary embodiments relate to a magnetic resonance imaging apparatus which includes a connector.

2. Description of the Related Art

In general, a medical imaging system is an apparatus that provides internal information about a patient as an image. Medical imaging systems include an X-ray machine, an ultrasonic diagnostic apparatus, a computer tomography scanner, a magnetic resonance imaging apparatus, etc.

A magnetic resonance imaging (MRI) apparatus holds an important position in the field of diagnostic technology using medical images, because the MRI apparatus functions under less stringent photographing conditions than other medical imaging apparatuses and provides superior contrast images of soft tissues and various diagnostic information images.

The MRI apparatus causes nuclear magnetic resonance in the hydrogen atomic nuclei of the human body by using a magnetic field which is harmless to humans and radio frequency (RF) energy which is non-ionizing radiation, to thereby image the densities and physical or chemical characteristics of the atomic nuclei.

In more detail, the MRI apparatus supplies energy which has a specific frequency and energy level to atomic nuclei in the state in which a constant magnetic field has been applied to the atomic nuclei, thereby causing the atomic nuclei to release energy, and converts the energy released from the atomic nuclei into signals, thereby facilitating a diagnosis of the inside of the human body.

When a magnetic field is applied to the atomic nuclei, protons configuring the atomic nuclei are arranged in the direction of the magnetic field since the protons have spin angular momentum and magnetic dipole moment, and the atomic nuclei perform precession with respect to the direction of the magnetic field. Precession causes nuclear magnetic resonance, through which an internal image of the human body is acquired.

The MRI apparatus applies a gradient field to a static field formed in a subject in order to acquire an image of the subject. The static field may be formed by a static coil unit. The gradient field may be formed by a gradient coil unit.

The gradient coil unit may be positioned inside the static coil unit. The gradient coil unit may include primary coils to generate a gradient field and shield coils to restrict generation of an eddy current.

Since a uniform static field should be formed in the subject, shims are provided for homogeneity of a static field formed by the static coil unit. The shims may be provided inside the gradient coil unit which forms a gradient field in a static field. If passive shims are used, the passive shims are configured with shim tokens and shim trays in which the shim tokens are accommodated.

SUMMARY

It is an aspect of one or more exemplary embodiments to provide a magnetic resonance imaging apparatus which is equipped with a connector configured to connect a gradient coil unit and a shield coil unit.

Additional aspects of the exemplary embodiments will be set forth in part in the description which follows and, in part, will be obvious from the description, or may be learned by practice of the exemplary embodiments.

In accordance with one aspect of one or more exemplary embodiments, a magnetic resonance imaging apparatus includes a static coil module configured to form a static field in a bore, a gradient coil module which includes at least one primary coil configured to form a gradient field in the static field and at least one shield coil configured to cancel an eddy current formed in the static coil module, and a first connector which includes a base made of an insulating material and a plurality of conductors which are coupled to the base and which are configured to connect the at least one primary coil and the at least one shield coil.

The apparatus may further include at least a second connector, and the first and at least second connectors may be spaced apart from each other and disposed in one from among a front portion and a rear portion of the gradient coil module.

The gradient coil module may include a plurality of shim trays which are arranged apart from each other, and the first connector and the at least second connector may be disposed between adjacent shim trays.

The first connector may include a first component which includes a first base made of an insulating material and a first conductor coupled to the first base, and a second component which includes a second base made of an insulating material and a second conductor coupled to the second base.

The first component may include a first coupling part, and the second component may include a second coupling part. The first component and the second component may be combinable into a single integrated structure by coupling the first coupling part to the second coupling part.

The first coupling part may be formed at the first base, and the second coupling part may be formed at the second base.

A first minimum distance from a coupling position of the first component and the second component to one end portion of the first conductor may be different from a second minimum distance from the coupling position of the first component and the second component to one end portion of the second conductor.

The apparatus may further include at least a second connector, and the first and at least second connectors may be mounted to a guide plate, and the guide plate may be mounted in at least one from among the front portion and the rear portion of the gradient coil module.

The guide plate may be formed in a shape which corresponds to a shape of at least one from among the front portion and the rear portion of the gradient coil module.

The guide plate may be formed in a shape which corresponds to at least one from among a part of a shape of the front portion of the gradient coil module and a part of a shape of the rear portion of the gradient coil module.

The guide plate may include a cooling device.

The guide plate may be mounted with a holder, and the cooling device may be fixed by the holder.

The guide plate may include a hook, and the cooling device may be fixed by the hook.

The cooling device may include a cooling channel which is formed in the guide plate.

The guide plate may include a withdrawing part configured with a hole, and a mounting part to which the first connector is mounted.

In accordance with another aspect of one or more exemplary embodiments, a magnetic resonance imaging apparatus includes a static coil module configured to form a static field in a bore, and a gradient coil module configured to form a gradient field in the static field. The gradient coil module includes at least one primary coil which is disposed in an inner part thereof, at least one shield coil which is disposed in an outer part thereof, and a first connector which includes a plurality of conductors and which is configured to connect the at least one primary coil and the at least one shield coil.

The plurality of conductors may be coupled to a base made of an insulating material.

The gradient coil module may include a plurality of shim trays which are arranged apart from each other, and the first connector may be disposed between adjacent shim trays.

The apparatus may further include at least a second connector, and the first and at least second connectors may be mounted to a guide plate, and the guide plate may be mounted in at least one from among a front portion and a rear portion of the gradient coil module.

The guide plate may include a cooling device configured to cool heat which is generated by the first connector and the at least the second connector.

As is apparent from the above description, because the connectors which are configured to connect the gradient coil module and the shield coil module are formed in one combined module, the magnetic resonance imaging apparatus may be efficiently manufactured. Further, because the bases of the connectors are made of an insulating material, an insulation distance between the coils may be preserved, and an unnecessary increase in size of the magnetic resonance imaging apparatus may be prevented.

BRIEF DESCRIPTION OF THE DRAWINGS

These and/or other aspects will become apparent and more readily appreciated from the following description of exemplary embodiments, taken in conjunction with the accompanying drawings of which.

DETAILED DESCRIPTION

Figure 1:
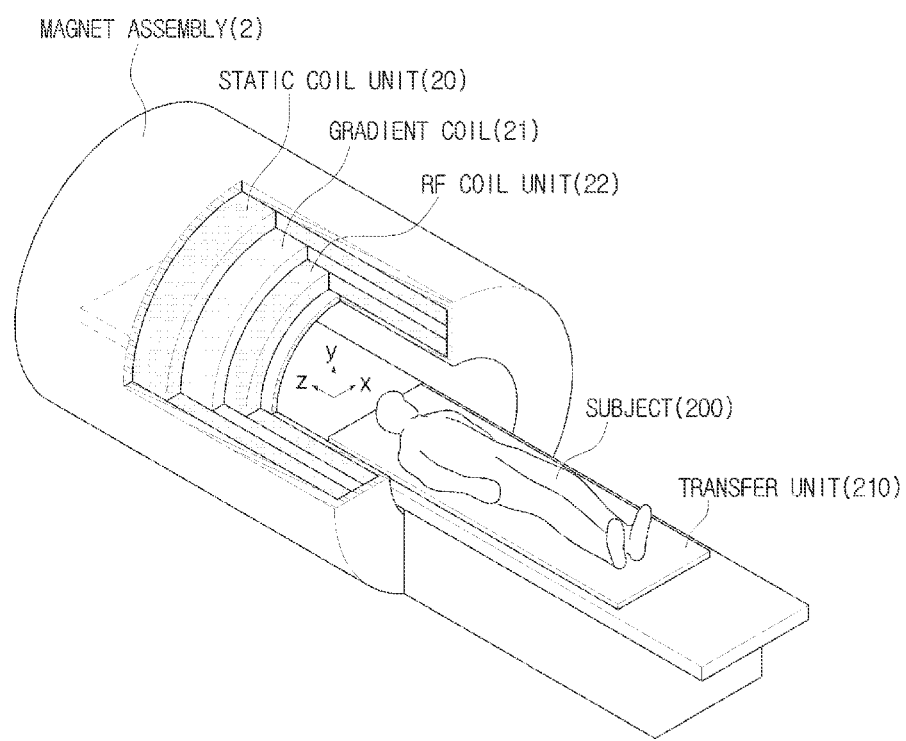
FIG. 1 is a schematic view illustrating a magnetic resonance imaging apparatus, according to an exemplary embodiment.

Reference will now be made in detail to exemplary embodiments, examples of which are illustrated in the accompanying drawings, wherein like reference numerals refer to like elements throughout.

Figure 2:
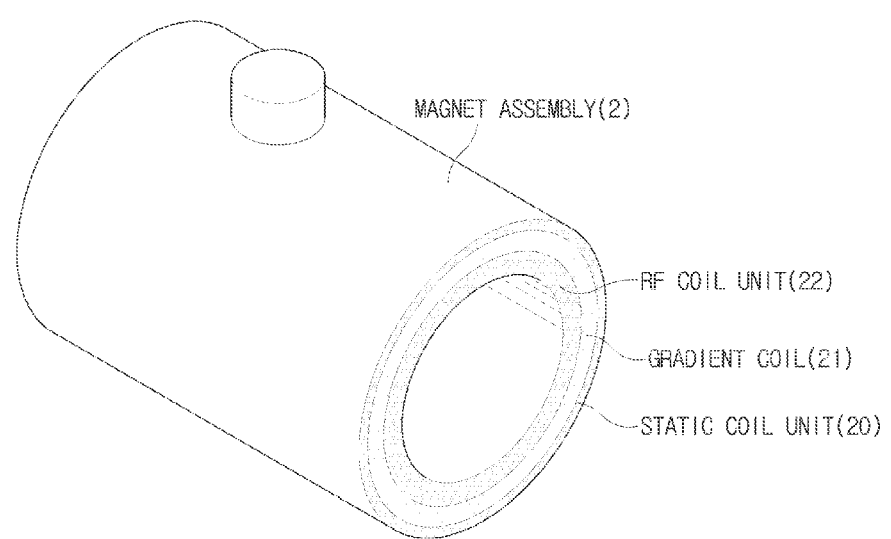
FIG. 2 is a view illustrating a structure of a magnet assembly and a structure of a gradient coil unit of the magnetic resonance imaging apparatus, according to an exemplary embodiment.
Figure 3:
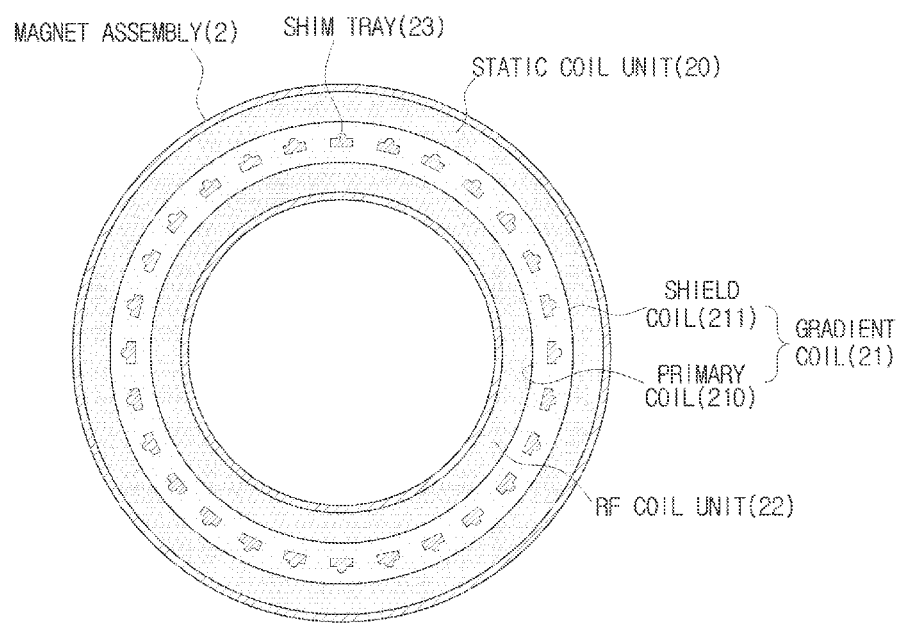
FIG. 3 is a sectional view of the magnet assembly of the magnetic resonance imaging apparatus, according to an exemplary embodiment.

FIG. 1 is a schematic view illustrating a magnetic resonance imaging apparatus according to an exemplary embodiment, FIG. 2 is a view illustrating a structure of a magnet assembly and a structure of a gradient coil unit of the magnetic resonance imaging apparatus, and FIG. 3 is a sectional view of the magnet assembly of the magnetic resonance imaging apparatus.

Referring to FIGS. 1, 2, and 3, a magnetic resonance imaging (MRI) apparatus 1 according to an exemplary embodiment may include a magnet assembly 2 which is configured to form a magnetic field and cause resonance in atomic nuclei. The magnet assembly 2 is formed in the shape of a hollow cylinder, and the inside space of the magnet assembly 2 may be referred to as a bore. A transfer unit 210 moves a subject 200 lying thereon into the bore in order to obtain a magnetic resonance signal.

The MRI apparatus 1 may include a controller configured to control an operation of the magnet assembly 2, an image processor configured to receive an echo signal which is generated from the atomic nuclei to create a magnetic resonance image, a user manipulation unit (also referred to herein as a "user manipulation device") configured to enable a user to manipulate the system, and a display unit (also referred to herein as a "display device" and/or a "display") to display a control state and display an image created by the image processor in order for a user to diagnose a health state of the subject 200.

The magnet assembly 2 may include a static coil unit (also referred to herein as a "static coil module") 20, a gradient coil (also referred to herein as a "gradient coil module") 21 and a RF coil unit (also referred to herein as a "RF coil module") 22. The static coil unit 20 is configured to form a static field therein. The gradient coil unit 21 is configured to form a gradient field in the static field. The RF coil unit 22 is configured to apply a pulse to excite atomic nuclei and to receive an echo signal from the atomic nuclei.

The static coil unit 20 may have a structure in which one or more coils are wound around the bore. If current is applied to the static coil unit 20, a static field is formed inside the magnet assembly 2, that is, in the bore. The direction of the static field is generally parallel to the concentric axis of the magnet assembly 2.

If the static field is formed in the bore, the atomic nuclei of atoms (e.g., hydrogen atoms) configuring the subject 200 are arranged in the direction of the static field, and perform precession with respect to the direction of the static field. Because hydrogen atoms constitute a relatively large proportion of atoms configuring the human body, the MRI apparatus acquires a magnetic resonance signal by using precession of hydrogen protons.

The gradient coil unit 21 generates a gradient in the static field formed in the bore in order to form a gradient field.

The gradient coil unit 21 may include one or more primary coils 210 and one or more shield coils 211. The one or more primary coils 210 are disposed in the inner part of the gradient coil unit 21, and the one or more shield coils 211 are disposed in the outer part of the gradient coil unit 21. The installation radius of the one or more shield coils 211 is greater than that of the one or more primary coils 210.

If a strong pulse of current is applied to the one or more primary coils 210, an eddy current which suppresses a generation of a gradient field flows through the static coil unit 20 surrounding the one or more primary coils 210. If the eddy current is induced in the static coil unit 20, a signal-to-noise ratio is deteriorated, and thus, it may become difficult to obtain an accurate image of the subject 200.

In order to overcome problems which may arise due to the eddy current, the one or more shield coils 211 are mounted in the outer part of the gradient coil unit 21. By canceling the strength of gradient field which extends out of the gradient coil unit 21 by the shield coils 211, the amount of eddy current may be reduced.

Figure 4:
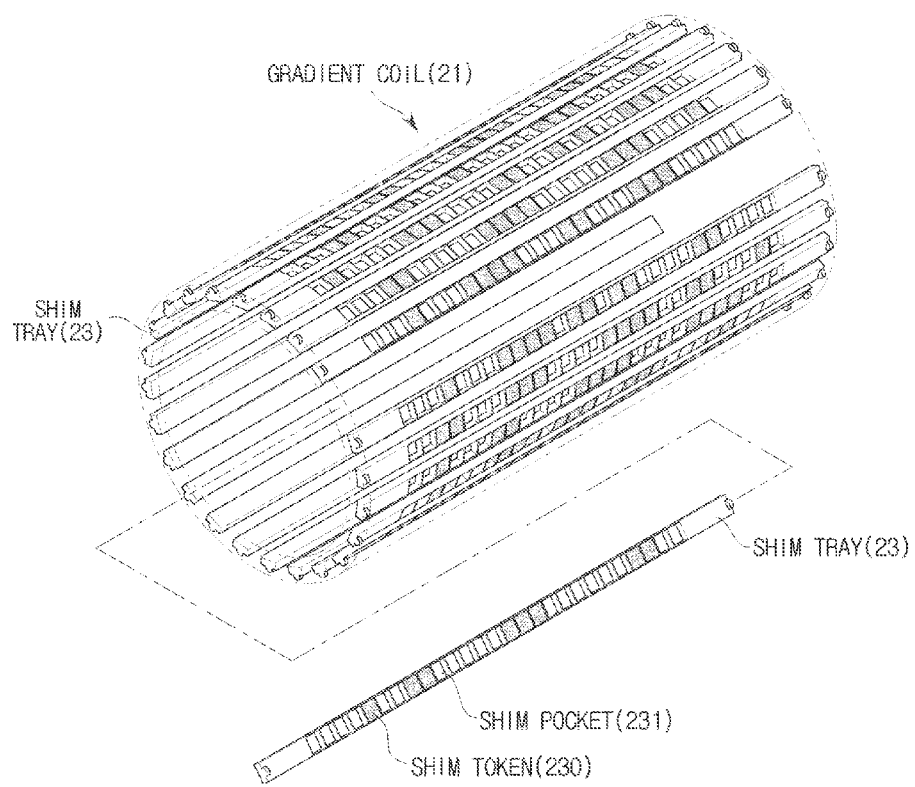
FIG. 4 is a view illustrating shim trays mounted in the gradient coil unit of the magnetic resonance imaging apparatus, according to an exemplary embodiment.

FIG. 4 is a view illustrating shim trays mounted in the gradient coil unit of the MRI apparatus, according to an exemplary embodiment.

Referring to FIG. 4, the magnet assembly 2 includes shims provided in the gradient coil unit 21 in order to uniformly distribute a static field that is formed by the static coil unit 20. The shims may be configured with a plurality of shim tokens provided in the gradient coil unit 21.

Shim trays 23 may be provided in the gradient coil unit 21. The shim tokens 230 may be accommodated in the shim trays 23. The shim trays 23 may have a length corresponding to the length in a z-axis direction of the gradient coil unit 21 which has a cylindrical shape. The inner space of each shim tray 23 may be partitioned into a plurality of spaces in which the plural shim tokens 230 are accommodated. The partitioned space of the shim tray 23, in which the shim token 230 is accommodated, may be referred to as a shim pocket 231.

One or more shim tokens 230 may be accommodated in each shim pocket 231. The number, weight, and/or size of the shim pockets 231 accommodating the shim tokens 230 or the shim tokens 230 accommodated in the shim pockets 231 may be calculated by using an algorithm which is previously determined in order to enhance homogeneity of a static field.

For example, after a magnetic field camera which includes a magnetic field sensor is placed in a photographing area in the bore, a magnetic field distribution on a surface of an imaginary sphere is measured by rotating the magnetic field camera by a predetermined angle. The magnetic field camera may have a semicircular or circular shape. Using the measured data which relate to the magnetic field distribution, an optimization of an arrangement of the shim tokens 230 is performed in order to achieve the target homogeneity of the static field distribution. Based on the optimization result, an arrangement of the shim tokens 230 to be accommodated in the shim pockets 231 of each shim tray 23 may be calculated. The arrangement of the shim tokens 230 may include the number, weight, and/or other information relating to the shim pockets 231 to accommodate the shim tokens 230 and the shim tokens 230 to be accommodated in the shim pockets 231. According to the calculated arrangement of the shim tokens 230, the shim tokens 230 may be arranged in the shim pockets 231 of each shim tray 23.

The shim trays 23, in which the shim tokens 230 are arranged, may be mounted to the gradient coil unit 21 in such a manner that the shim trays 23 are inserted into shim accommodating parts which are formed in the gradient coil unit 21 in the z-axis direction. The shim accommodating parts may be formed with a predetermined interval therebetween in a circumferential direction when the gradient coil unit 21 is manufactured.

The shim tokens 230 may be made of silicon steel, cobalt steel or the like, however, the exemplary embodiments are not limited thereto. If the shim tokens are placed in a magnetic field, the shim tokens are magnetized. The direction of the magnetic field which is generated by magnetization of the shim tokens is opposite to the direction of a main magnetic field. In particular, the magnetic field which is generated by magnetization of the shim tokens cancels the surrounding static field and reduces the strength thereof. By adequately arranging the shim tokens using such characteristics of the shim tokens, the static field in the photographing area may be uniformly distributed.

If current is applied to the one or more primary coils 210 and/or to the one or more shield coils 211, heat may be generated by resistance of the coils. The generated heat may raise a temperature of the shim tokens 230. Because a change in temperature of the shim tokens acts as a factor with respect to changing the homogeneity of a static field, the gradient coil unit 21 may include a cooling unit (also referred to herein as a "cooling device") which is capable of cooling the shim tokens 230 in order to prevent the temperature of the shim tokens 230 from being raised.

Figure 5:
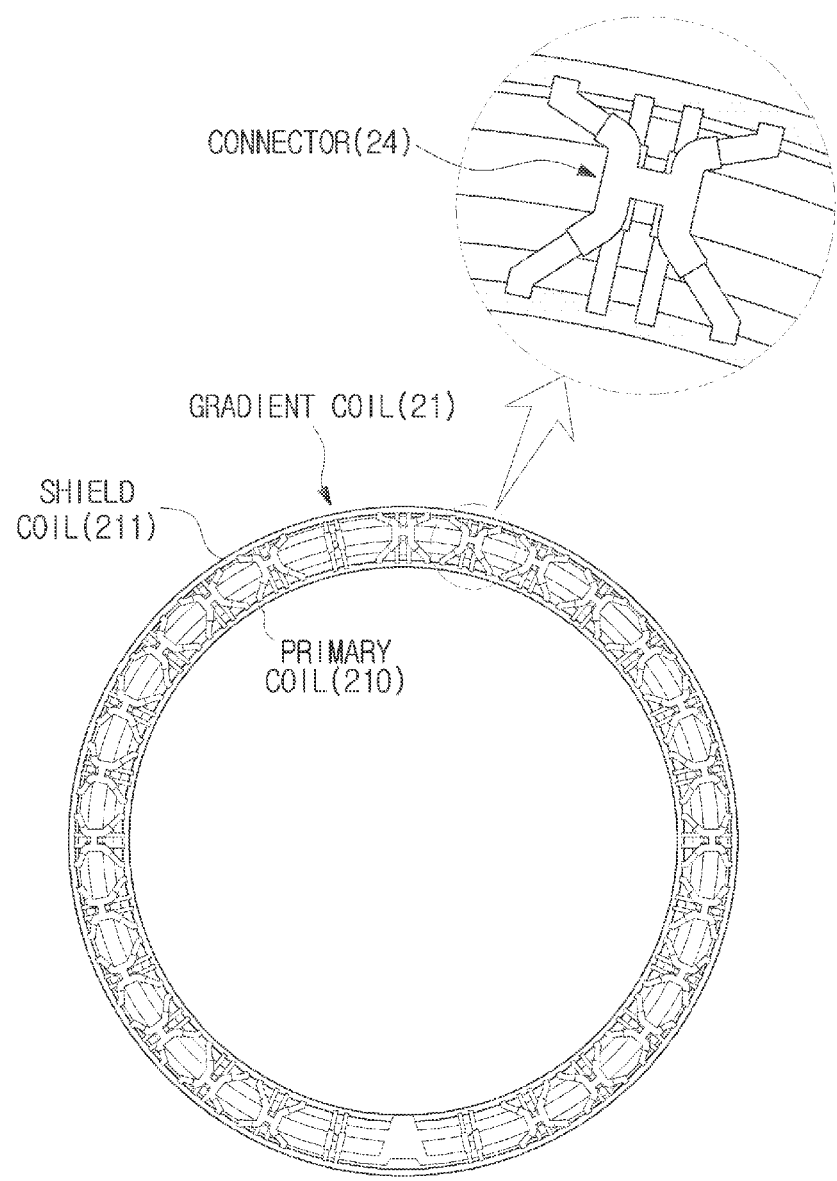
FIG. 5 is a view illustrating a front of the magnet assembly of the magnetic resonance imaging apparatus, according to an exemplary embodiment.

FIG. 5 is a view illustrating a front of the magnet assembly of the MRI apparatus, according to an exemplary embodiment.

Referring to FIG. 5, the gradient coil unit 21 of the magnet assembly 2 includes the one or more primary coils 210 and the one or more shield coils 211. The shield coils 211 are provided to cancel an eddy current which suppresses generation of a gradient field. The primary coils 210 are disposed in the inner part of the gradient coil unit 21, and the shield coils 211 are disposed in the outer part of the gradient coil unit 21. The primary coils 210 and the shield coils 211 may be connected to each other by a connector 24.

The connector 24 may be disposed in the front portion or the rear portion of the magnet assembly 2. The connector 24 may be include a plurality of connectors. The plurality of connectors 24 may be arranged in the form of a ring and arranged with a predetermined interval therebetween in the gradient coil unit 21 and disposed in the front portion or the rear portion of the magnet assembly 2.

Figure 7:
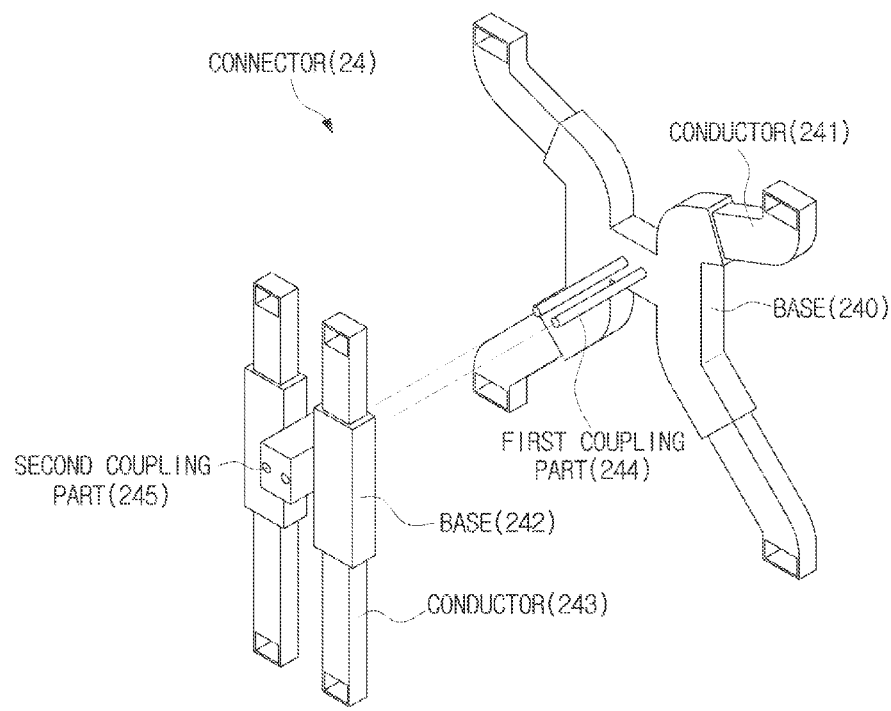
FIG. 7 is a view illustrating a disassembled appearance of the connector of the magnetic resonance imaging apparatus, according to an exemplary embodiment.

Referring also to FIG. 7, each connector 24 includes bases 240 and 242 and conductors 241 and 243. The conductors 241 and 243 may be coupled to the bases 240 and 242. The bases 240 and 242 may be formed to cover a part of the conductors 241 and 243. The bases 240 and 242 may be made of an insulating material. The conductors 241 and 243 may be made of a metal material which is capable of transmitting and/or conducting electricity. The primary coils 210 may be connected to one portion of the conductors 241 and 243, and the shield coils 211 may be connected to the other portion of the conductors 241 and 243.

The connectors 24 may be arranged so as to avoid interference with the shim trays 23 provided at the gradient coil unit 21. The shim tokens 230 may be accommodated in the shim pockets 231 which are provided in the shim trays 23 in order to achieve homogeneity of a static field. In order to arrange the shim tokens 230 accommodated in the shim pockets 231 in the gradient coil unit 21, the shim trays 23 may be provided so as to be drawn out of the front portion or the rear portion of the magnet assembly 2. Accordingly, the connectors 24 may be positioned without interference with the shim trays 23 in order not to interrupt withdrawal and insertion of the shim trays 23.

Because the primary coils 210 and the shield coils 211 should be connected to each other without interference with the shim trays 23, the connector 24 is positioned between any one of shim trays 23 disposed in the gradient coil unit 21 and another adjacent shim tray 23 in order to connect the plurality of primary coils 210 and the plurality of shield coils 211. The connector 24 may be formed as a single integrated unit so as to connect the plurality of primary coils 210 and the plurality of shield coils 211.

Figure 6A:
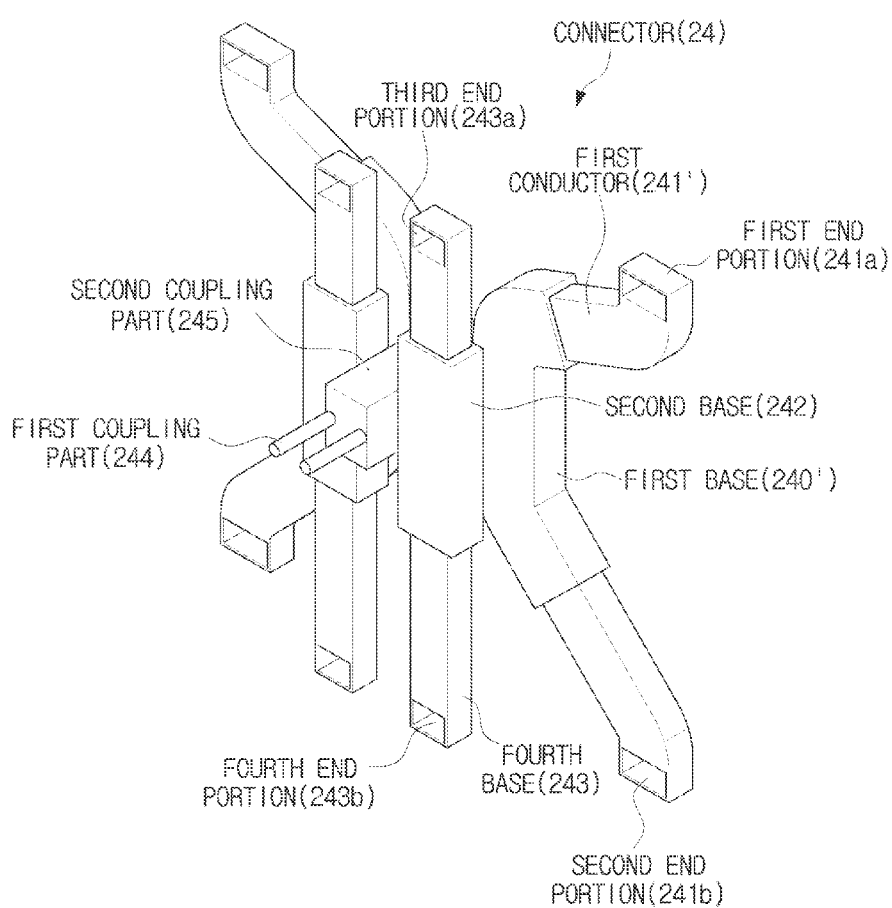
FIGS. 6A, 6B, and 6C are views illustrating examples of connectors of the magnetic resonance imaging apparatus, according to an exemplary embodiment.
Figure 6B:
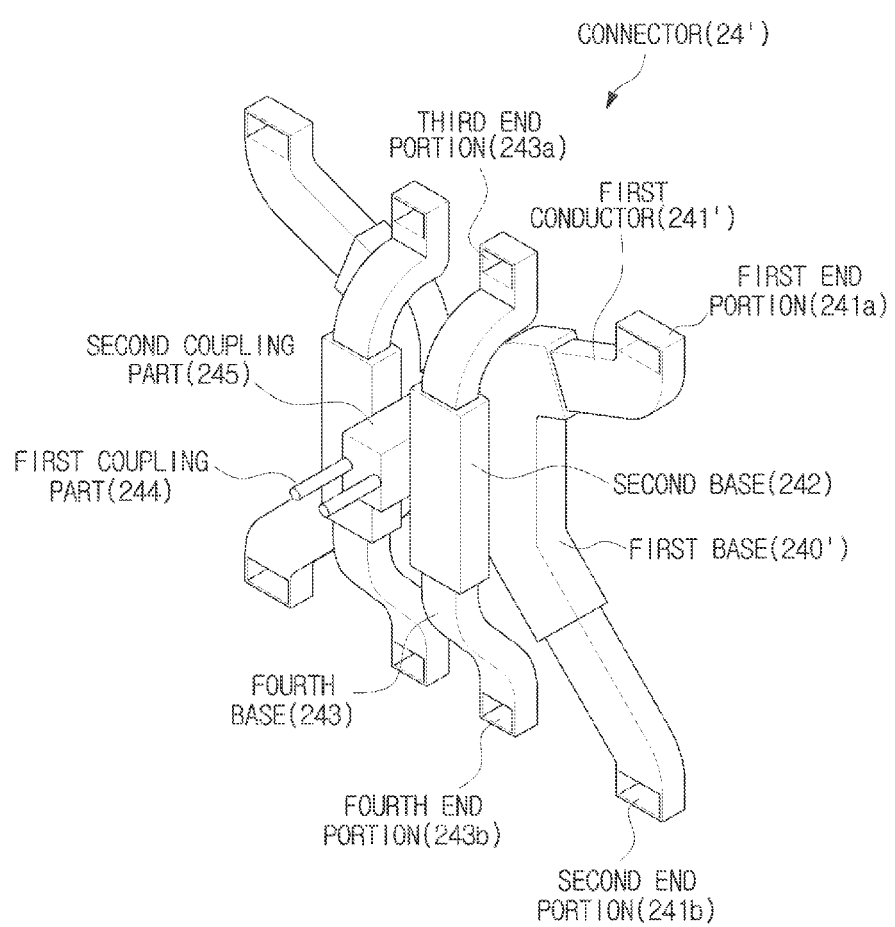
Figure 6C:
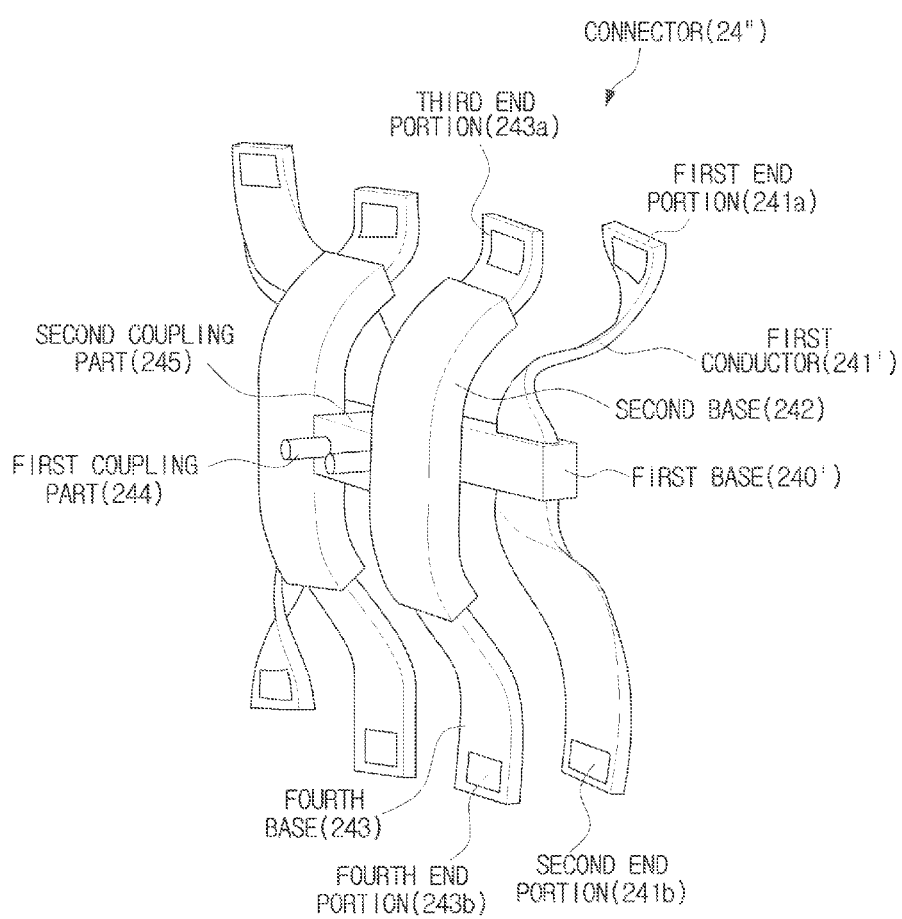

FIGS. 6A, 6B, and 6C are views illustrating examples of the connectors of the MRI apparatus according to an exemplary embodiment, and FIG. 7 is a view illustrating a disassembled appearance of the connector.

Referring to FIGS. 5, 6A, 6B, 6C, and 7, the connector 24 may be formed in any one or more of various shapes. Each connector 24 may be formed as a single integrated unit so as to connect the plurality of primary coils 210 and the plurality of shield coils 211.

For instance, the connector unit may include a first base 240' made of an insulating material and a first conductor 241' coupled to the first base 240'. The first base 240' may cover a part of an outer surface of the first conductor 241'. The first base 240' and the first conductor 241' may be referred to as a first unit and/or as a first component. The connector unit may include a second base 242 made of an insulating material and a second conductor 243 coupled to the second base 242. The second base 242 may cover a part of the second conductor 243. The second base 242 and the second conductor 243 may be referred to as a second unit and/or as a second component.

The second unit may be coupled to a portion of the first unit. The second unit may be coupled to a front portion or a rear portion of the first unit. According to an exemplary embodiment wherein the second unit is coupled to a front portion of the first unit, a first coupling part 244 may be provided at the front portion of the first base 240'. The first coupling part 244 may be formed to protrude forward from the first base 240'. A second coupling part 245 may be provided at the second base 243. The second coupling part 245 may be coupled to the first coupling part 244. The second coupling part 245 may be configured with a hole into which the first coupling part 244 is inserted. Accordingly, the second unit may be coupled to the front portion of the first unit.

One end portion of the first conductor 241' may be referred to as a first end portion 241*a*, and the other end portion of the first conductor 241' may be referred to as a second end portion 241*b*. One end portion of the second conductor 243 may be referred to as a third end portion 243*a*, and the other end portion of the second conductor 243 may be referred to as a fourth end portion 243*b*.

When the connector 24 is observed from the front after the first unit and the second unit are coupled, the first end portion 241*a* and the third end portion 243*a* do not overlap. The minimum distance from the coupling position of the first coupling part 244 and the second coupling part 245 to the first end portion 241*a* may be different from the minimum distance from the coupling position of the first coupling part 244 and the second coupling part 245 to the third end portion 243*a*. For example, the minimum distance from the coupling position of the first coupling part 244 and the second coupling part 245 to the first end portion 241*a* may be greater than the minimum distance from the coupling position of the first coupling part 244 and the second coupling part 245 to the third end portion 243*a*.

Similar to the above, when the connector 24 is observed from the front after the first unit and the second unit are coupled, the second end portion 241*b* and the fourth end portion 243*b* do not overlap. The minimum distance from the coupling position of the first coupling part 244 and the second coupling part 245 to the second end portion 241*b* may be greater than the minimum distance from the coupling position of the first coupling part 244 and the second coupling part 245 to the fourth end portion 243*b*.

When the first unit and the second unit are coupled as described above, the first conductor 241' and the second conductor 243 may be insulated with respect to each other without contact therebetween. Because the first coupling part 244 provided at the insulative first base 240' and the second coupling part 245 provided at the insulative second base 242 are coupled and the first unit and the second unit are coupled at the junction between the insulative first base 240' and the second base 242, insulation between the first unit and the second unit may be achieved.

Although it has been described above that the connector is formed as a single integrated unit in which the first conductor 241' is coupled to the front portion or rear portion of the second conductor 243, the number of conductors and bases provided in one single integrated unit is not limited to the above description. The coupling position of the first base 240' and the second base 242 is also not limited to the above description.

The connector 24 may be formed in any one or more of various shapes. As illustrated in FIG. 6A, the first unit of the connector 24 according to an exemplary embodiment may be formed such that both end portions are bent to the side. The second unit may be formed in a straight bar shape.

The conductors included in the connector may be bent in a different shape from the above-described shape. In particular, the conductors included in the connector may be bent in any one or more of various shapes which are capable of easily connecting the plurality of primary coils 210 and the plurality of shield coils 211 while maintaining an insulation state.

For example, as illustrated in FIG. 6B, the first unit of the connector 24' according to another exemplary embodiment may be formed such that both end portions are bent to the side, and the second unit may be formed such that a center portion protrudes forward. In such a case, because the first base 240' provided with the first coupling part 244' and the second base 242 provided with the second coupling part 245' are separated from each other, insulation may be more securely achieved. As illustrated in FIG. 6C, the first conductor 241' included in the connector 24" according to a further exemplary embodiment may be formed in a spirally twisted shape. The second conductor 243 may also be formed in a spirally twisted shape.

The connector may include the plurality of conductors and the plurality of bases, and may be formed in any one or more of various shapes to connect the primary coils 210 and the shield coils 211. Although the connector may be formed in any of various shapes, a connector module including the connectors 24 according to an exemplary embodiment will be described hereinafter.

Figure 8:
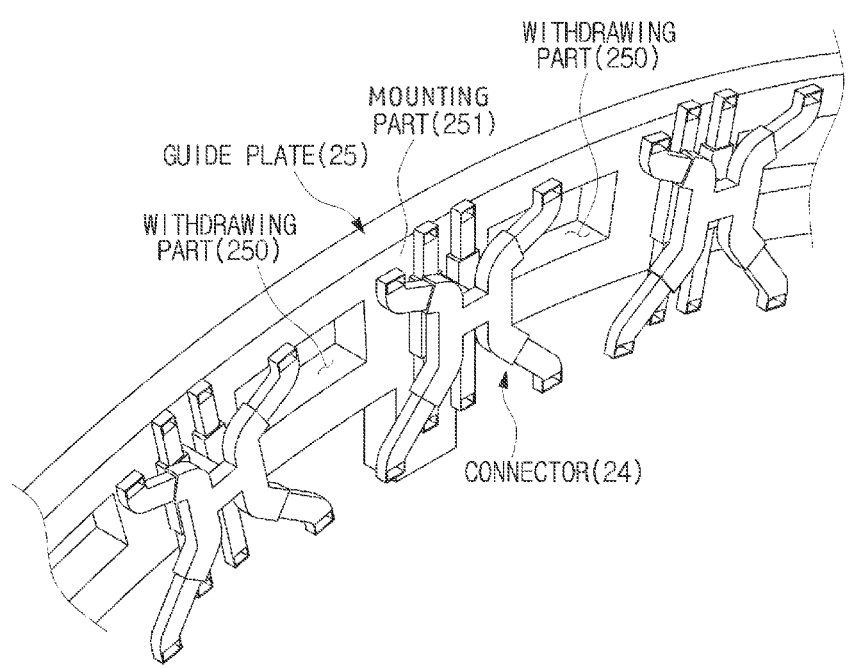
FIG. 8 is a view illustrating an example of a connector module of the magnetic resonance imaging apparatus, according to an exemplary embodiment.

FIG. 8 is a view illustrating an example of a connector module of the MRI apparatus, according to an exemplary embodiment.

Referring to FIG. 8, the connector 24 may include a plurality of connectors, and the plurality of connectors 24 may be mounted to a guide plate 25 in one single integrated module. A structure wherein the plurality of connectors 24 are mounted to the guide plate 25 may be referred to as a connector module.

The guide plate 25 may be mounted to a front portion or a rear portion of the magnet assembly 2. The guide plate 25 may have a shape corresponding to the shape of the front portion or to the shape of the rear portion of the magnet assembly 2. The guide plate 25 may also have a shape corresponding to a part of the shape of the front portion or to a part of the shape of the rear portion of the magnet assembly 2. In the case wherein the guide plate 25 has a shape corresponding to a part of the shape of the front portion or to a part of the shape of the rear portion of the magnet assembly 2, a plurality of connector modules may be mounted to the front portion or to the rear portion of the magnet assembly 2.

The guide plate 25 includes withdrawing parts 250 and mounting parts 251. The withdrawing parts 250 may be configured with holes through which the shim trays 23 are drawn out. The guide plate 25 may be mounted to the front portion or to the rear portion of the magnet assembly 2 so that the withdrawing parts 250 are positioned in correspondence with the shim trays 23. The connectors 24 may be mounted to the mounting parts 251. The withdrawing parts 250 and the mounting parts 251 may be alternately arranged with respect to each other.

Because the plurality of connectors 24 are mounted to the guide plate 25 in a single integrated connector module and such a connector module is mounted to the magnet assembly 2, the plurality of connectors 24 may be mounted to the magnet assembly 2 rapidly and easily without repeated mounting processes.

Figure 9:
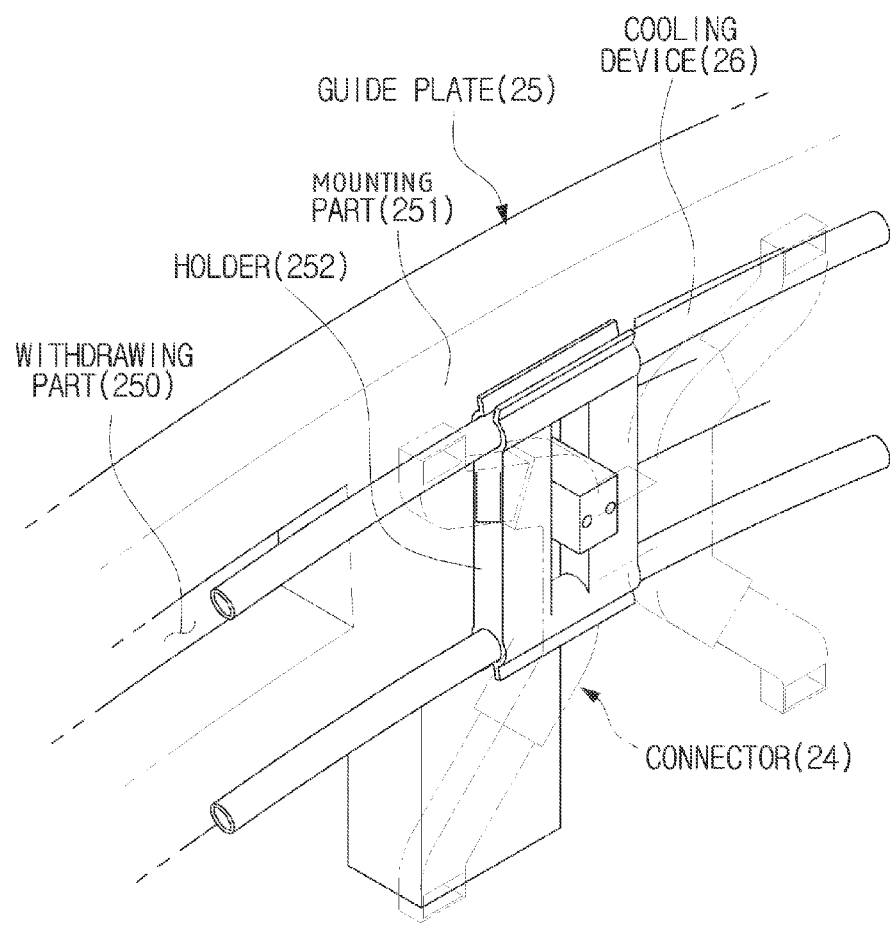
FIGS. 9, 10, and 11 are views illustrating a state of mounting cooling devices with respect to the connectors of the magnetic resonance imaging apparatus, according to an exemplary embodiment.
Figure 10:
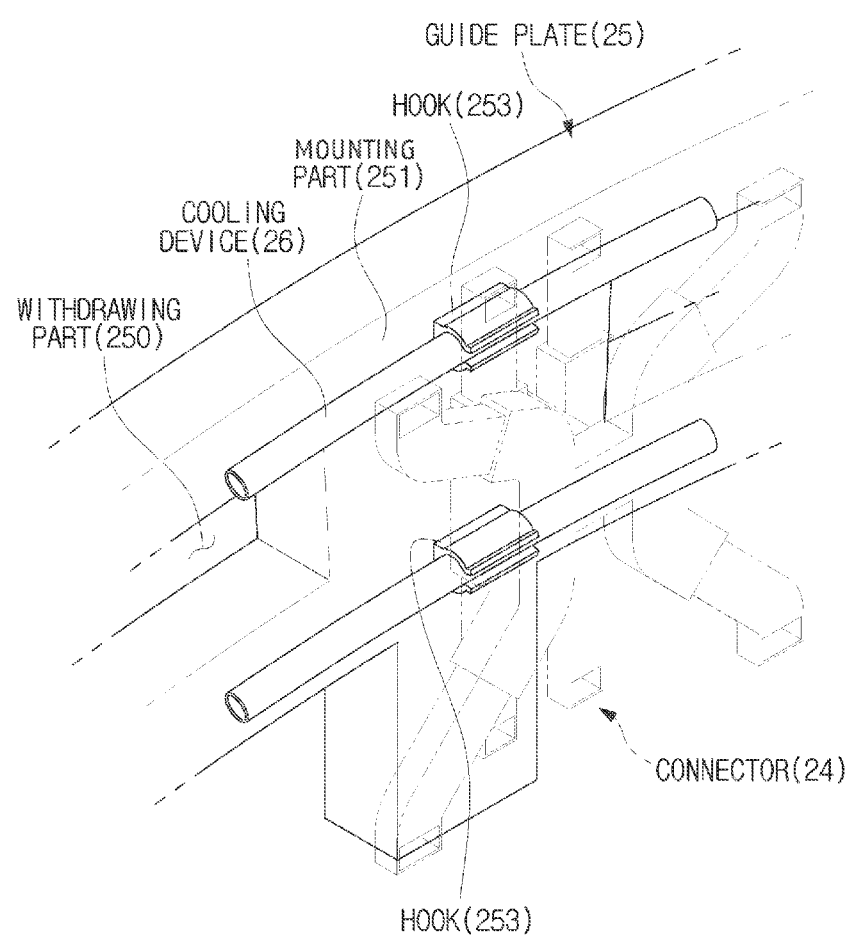
Figure 11:
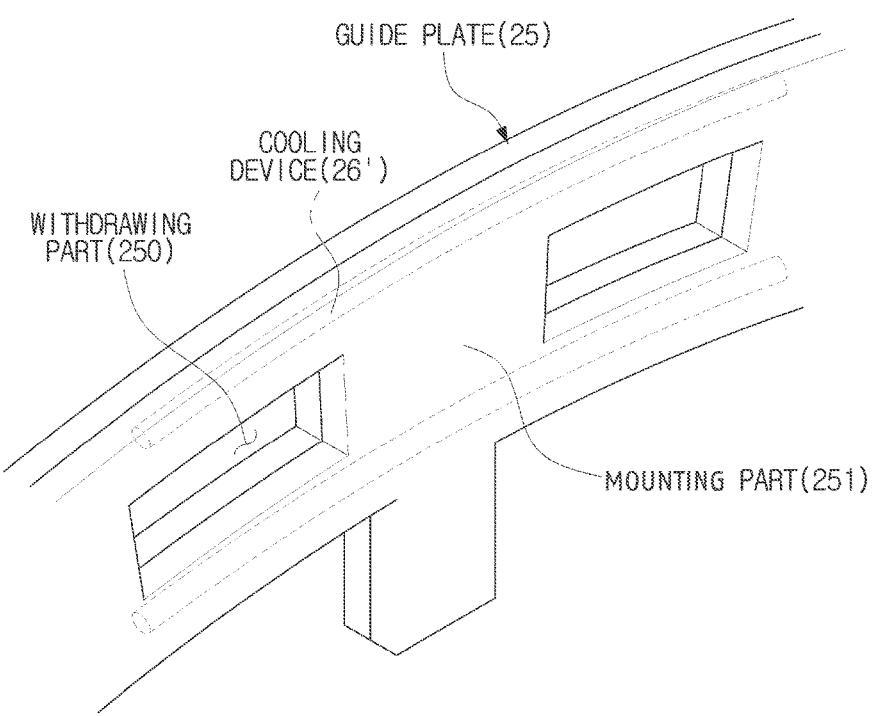

FIGS. 9, 10, and 11 are views illustrating a state of mounting cooling devices with respect to the connectors of the MRI apparatus, according to an exemplary embodiment.

Referring to FIGS. 9, 10, and 11, cooling devices 26 may be mounted in close proximity to the connectors 24. One or more of the cooling devices 26 may include a tube through which coolant flows. The cooling devices 26 may cool the heat generated by the connectors 24.

As illustrated in FIG. 9, the cooling devices 26 may be fixed by holders 252 mounted to the magnet assembly 2. The holders 252 which are configured to hold the cooling devices 26 may be separately prepared and mounted to the guide plate 25 and/or to the connectors 24. The cooling devices 26 may be positioned so as to pass through the rear portions of the respective connectors 24. The cooling devices 26 may be respectively provided near both end portions of the corresponding connectors 24.

As illustrated in FIG. 10, the cooling devices 26 may be fixed by hooks 253 which are provided at the guide plate 25. The hooks 253 may be provided integrally with the guide plate 25. The plurality of hooks 253 may be spaced apart from each other so that the cooling devices 26 are respectively positioned near both end portions of the corresponding connectors 24.

As illustrated in FIG. 11, the cooling devices 26 may be mounted inside the guide plate 25. When the guide plate 25 is formed, tube-shaped cooling channels 26', through which coolant passes, may be provided inside the guide plate 25. The cooling channels 26' may be respectively positioned near both end portions of the corresponding connectors 24.

Because the cooling devices 26 are provided near the respective connectors 24, the heat generated from connecting points between the primary coils 210 and the conductors and connecting points between the shield coils 211 and the conductors may be cooled by the cooling devices 26.

As described above, the primary coils 210 and the shield coils 211 of the gradient coil unit 21 may be connected to each other by the connectors 24. In detail, each respective pair of the plurality of primary coils 210 and the plurality of shield coils 211 may be connected by the corresponding connectors 24, including the plurality of conductors 241 and 243. The plurality of connectors 24 may be mounted to the guide plate 25 in a single integrated module, and the connector module may be mounted to the magnet assembly 2. As a result, the plurality of connectors 24 may be rapidly and easily mounted to the magnet assembly 2.

Although a few exemplary embodiments have been shown and described, it will be appreciated by those of skill in the art that changes may be made in these exemplary embodiments without departing from the principles and spirit of the present inventive concept, the scope of which is defined in the claims and their equivalents.

What is claimed is:

1. A magnetic resonance imaging (MRI) apparatus comprising:
 a static coil module configured to form a static magnetic field in a bore;
 a gradient coil module which includes at least one primary coil configured to form a gradient field in the static magnetic field and at least one shield coil configured to cancel an eddy current formed in the static coil module; and
 a first connector and a second connector, each of the first connector and the second connector including a respective conductor configured to connect the at least one primary coil and the at least one shield coil of the gradient coil module,
 wherein the first connector includes a first component which includes a first base made of an insulating material and a first conductor coupled to the first base, and the second connector includes a second component which includes a second base made of an insulating material and a second conductor coupled to the second base,
 wherein the first component includes a first coupling part, and the second component includes a second coupling part, and the first component and the second component are combinable into a single integrated structure by coupling the first coupling part to the second coupling part, and
 wherein each of the first connector and the second connector has a shade that is defined by a superposition of an H and an X.

2. The MRI apparatus according to claim 1, wherein the first connector and the second connector are spaced apart from each other and disposed in one from among a front portion and a rear portion of the gradient coil module.

3. The MRI apparatus according to claim 2, wherein the gradient coil module includes a plurality of shim trays which are arranged apart from each other, and the first connector and the second connector are disposed between adjacent shim trays.

4. The MRI apparatus according to claim 1, wherein the first coupling part is formed at the first base, and the second coupling part is formed at the second base.

5. The MRI apparatus according to claim 1, wherein the first connector and the second connector are mounted to a guide plate, and wherein the guide plate is mounted in at least one from among a front portion and a rear portion of the gradient coil module.

6. The MRI apparatus according to claim 5, wherein the guide plate is formed in a shape which corresponds to a shape of at least one from among the front portion and the rear portion of the gradient coil module.

7. The MRI apparatus according to claim 5, wherein the guide plate is formed in a shape which corresponds to at least one from among a part of a shape of the front portion of the gradient coil module and a part of a shape of the rear portion of the gradient coil module.

8. The MRI apparatus according to claim 5, wherein the guide plate includes a cooling device.

9. The MRI apparatus according to claim 8, wherein the guide plate is mounted with a holder, and the cooling device is fixed by the holder.

10. The MRI apparatus according to claim 8, wherein the guide plate includes a hook, and the cooling device is fixed by the hook.

11. The MRI apparatus according to claim 8, wherein the cooling device includes a cooling channel which is formed in the guide plate.

12. The MRI apparatus according to claim 5, wherein the guide plate includes a withdrawing part configured with a hole, and a mounting part to which the first connector is mounted.

13. A magnetic resonance imaging (MRI) apparatus comprising:
    a static coil module configured to form a static magnetic field in a bore; and
    a gradient coil module configured to form a gradient field in the static magnetic field,
    wherein the gradient coil module includes at least one primary coil which is disposed in an inner part thereof, at least one shield coil which is disposed in an outer part thereof, and a first connector and a second connector, each of the first connector and the second connector including a respective conductor which is configured to connect the at least one primary coil and the at least one shield coil of the gradient coil module,
    wherein the first connector includes a first component which includes a first base made of an insulating material and a first conductor coupled to the first base, and the second connector includes a second component which includes a second base made of an insulating material and a second conductor coupled to the second base,
    wherein the first component includes a first coupling part, and the second component includes a second coupling part, and the first component and the second component are combinable into a single integrated structure by coupling the first coupling part to the second coupling part, and
    wherein each of the first connector and the second connector has a shape that is defined by a superposition of an H and an X.

14. The MRI apparatus according to claim 13, wherein the gradient coil module includes a plurality of shim trays which are arranged apart from each other, and wherein the first connector is disposed between adjacent shim trays.

15. The MRI apparatus according to claim 13, wherein the first connector and the second connector are mounted to a guide plate, and the guide plate is mounted in at least one from among a front portion and a rear portion of the gradient coil module.

16. The MRI apparatus according to claim 15, wherein the guide plate includes a cooling device configured to cool heat which is generated by the first connector and the second connector.

17. A method of assembling components of a magnetic resonance imaging (MRI) apparatus which includes a static coil module configured to form a static magnetic field in a bore and a gradient coil module which includes at least one primary coil configured to form a gradient field in the static magnetic field and at least one shield coil configured to cancel an eddy current formed in the static coil module, the method comprising:
    forming a first connector as a single integrated component so that the first connector includes a first base made of an insulating material and a first plurality of conductors which are coupled to the first base;
    forming a second connector as a single integrated component so that the second connector includes a second base made of an insulating material and a second plurality of conductors which are coupled to the second base; and
    using each of the first connector and the second connector in order to connect the at least one primary coil with the at least one shield coil of the gradient coil module,
    wherein the first connector includes a first component which includes the first base and the first plurality of conductors, and the second connector includes a second component which includes the second base and the second plurality of conductors,
    wherein the first component includes a first coupling part, and the second component includes a second coupling part, and the first component and the second component are combinable into a single integrated structure by coupling the first coupling part to the second coupling part, and
    wherein each of the first connector and the second connector has a shape that is defined by a superposition of an H and an X.

18. The method according to claim 17, further comprising arranging the first connector and the second connector to be spaced apart from each other and disposed in one from among a front portion and a rear portion of the gradient coil module.

19. The method according to claim 17, further comprising mounting the first connector and the second connector to a guide plate, wherein the guide plate is mounted in at least one from among a front portion and a rear portion of the gradient coil module.

20. The method according to claim 19, further comprising using a cooling device to dissipate heat generated by the first connector and the at least the second connector, wherein the cooling device is mounted inside the guide plate.

* * * * *